US012215418B2

(12) United States Patent
Varjos et al.

(10) Patent No.: US 12,215,418 B2
(45) Date of Patent: Feb. 4, 2025

(54) APPARATUSES AND METHOD FOR ORIENTED DEPOSITION

(71) Applicant: Canatu Finland Oy, Vantaa (FI)

(72) Inventors: Ilkka Varjos, Espoo (FI); Anton Sergeevich Anisimov, Espoo (FI); Bjørn Fridur Mikladal, Helsinki (FI); Dewei Tian, Kerava (FI)

(73) Assignee: Canatu Finland Oy, Vantaa (FI)

( * ) Notice: Subject to any disclaimer, the term of this patent is extended or adjusted under 35 U.S.C. 154(b) by 259 days.

(21) Appl. No.: 17/603,429

(22) PCT Filed: Apr. 20, 2020

(86) PCT No.: PCT/FI2020/050259
§ 371 (c)(1),
(2) Date: Oct. 13, 2021

(87) PCT Pub. No.: WO2020/216988
PCT Pub. Date: Oct. 29, 2020

(65) Prior Publication Data
US 2022/0195597 A1 Jun. 23, 2022

(30) Foreign Application Priority Data
Apr. 24, 2019 (FI) ..................................... 20195327

(51) Int. Cl.
*C23C 16/455* (2006.01)
*C01B 32/15* (2017.01)
(Continued)

(52) U.S. Cl.
CPC ........ *C23C 16/45504* (2013.01); *C01B 32/15* (2017.08); *C23C 16/06* (2013.01);
(Continued)

(58) Field of Classification Search
CPC ... C23C 16/45504; C23C 16/06; C23C 16/26; C23C 16/4412; C23C 16/45591;
(Continued)

(56) References Cited

U.S. PATENT DOCUMENTS 9,133,022 B2 9/2015 Brown et al.
2007/0036709 A1 2/2007 Lashmore et al.
(Continued)

FOREIGN PATENT DOCUMENTS

CN 102328898 A 1/2012
CN 102701185 A 10/2012
(Continued)

OTHER PUBLICATIONS

Office Action dated Jan. 3, 2024 for the corresponding Taiwanese patent application 109113173 (11 pages including English Translation).
(Continued)

*Primary Examiner* — Jeffrie R Lund
(74) *Attorney, Agent, or Firm* — Merchant & Gould P.C.

(57) ABSTRACT

Apparatuses and a method for gas phase deposition of high aspect ratio molecular structures, HARM-structures, are presented. The first aspect relates to an apparatus configured for oriented gas phase deposition of HARM-structures on a filter. The second aspect relates to an apparatus configured for oriented gas phase deposition of HARM-structures on a substrate. A system comprising multiple apparatuses according to the second aspect is also presented. Elements of the apparatuses are arranged to create a laminar flow of gas comprising HARM-structures in the deposition area, and to direct this flow at least partially parallel to the deposition area. Another aspect of the invention is a method for oriented deposition of HARM-structures, suitable for deposition both on a filter and a substrate.

28 Claims, 5 Drawing Sheets

(51) Int. Cl.
*C23C 16/06* (2006.01)
*C23C 16/26* (2006.01)
*C23C 16/44* (2006.01)
*C23C 16/52* (2006.01)
*C23C 24/04* (2006.01)

(52) U.S. Cl.
CPC .......... *C23C 16/26* (2013.01); *C23C 16/4412* (2013.01); *C23C 16/45591* (2013.01); *C23C 16/52* (2013.01); *C23C 24/04* (2013.01)

(58) Field of Classification Search
CPC ..... C23C 16/52; C23C 24/04; C23C 18/1262; C01B 32/15; B05D 2401/32; B05D 1/12; B05D 1/06; B82Y 40/00; B01D 46/0039; H10K 85/20
See application file for complete search history.

(56) References Cited

U.S. PATENT DOCUMENTS

| | | | |
|---|---|---|---|
| 2008/0308209 | A1 | 12/2008 | Loutfy et al. |
| 2009/0032741 | A1 | 2/2009 | Lashmore et al. |
| 2009/0280238 | A1 | 11/2009 | Brown et al. |
| 2010/0163844 | A1 | 7/2010 | Ermolov |
| 2010/0196600 | A1 | 8/2010 | Shibuya et al. |
| 2011/0014446 | A1 | 1/2011 | Saito |
| 2011/0023775 | A1* | 2/2011 | Nunes ............... C23C 16/45551 118/500 |
| 2011/0212308 | A1 | 9/2011 | Brown et al. |
| 2012/0107220 | A1 | 5/2012 | Shibuya |
| 2017/0087591 | A1 | 3/2017 | Decher et al. |
| 2018/0290886 | A1 | 10/2018 | Brown |
| 2019/0001360 | A1 | 1/2019 | Lefebvre et al. |
| 2022/0195597 | A1* | 6/2022 | Varjos ..................... C23C 16/52 |
| 2023/0207426 | A1* | 6/2023 | Yaglioglu .......... H05K 7/20281 257/714 |

FOREIGN PATENT DOCUMENTS

| | | | |
|---|---|---|---|
| CN | 104575658 | A | 4/2015 |
| CN | 104724670 | A | 6/2015 |
| JP | 2009528971 | A | 8/2009 |
| JP | 2010534613 | A | 11/2010 |
| JP | 2012516277 | A | 7/2012 |
| JP | WO2011001969 | A1 | 12/2012 |
| JP | 2013530053 | A | 7/2013 |
| JP | 2018534120 | A | 11/2018 |
| WO | 2008/157520 | A1 | 12/2008 |

OTHER PUBLICATIONS

Notification of reasons for refusal dated Mar. 12, 2024 for the corresponding Japanese patent application 2021-561922 (6 pages with English Translation).
Chinese Office Action for CN Application No. 202080036289.9 mailed Jan. 12, 2022 (12 pages, with English translation).
International Search Report for PCT Application No. PCT/FI2020/050259 mailed Jun. 19, 2020 (4 pages).
Written Opinion for PCT Application No. PCT/FI2020/050259 mailed Jun. 19, 2020 (7 pages).
PCT International Preliminary Report on Patenability for PCT Application No. PCT/FI2020/050259 mailed Jul. 16, 2021 (7 pages).
Finnish Search Report for FI Application No. 20195327 mailed Nov. 14, 2019 (2 pages).
Office Action dated Aug. 27, 2024 for the corresponding Japanese patent application 2021-561922 (8 pages including English Translation).

* cited by examiner

APPARATUSES AND METHOD FOR ORIENTED DEPOSITION

CROSS-REFERENCE TO RELATED APPLICATIONS

This application is a National Stage Application of PCT/FI2020/050259, filed 20 Apr. 2020, which claims benefit of Ser. No. 20/195,327, filed 24 Apr. 2019 in Finland, and which applications are incorporated herein by reference. To the extent appropriate, a claim of priority is made to each of the above disclosed applications.

FIELD OF THE INVENTION

The present invention relates to gas phase deposition. In particular, the invention relates to methods of deposition and apparatuses comprising means for oriented deposition of high aspect ratio molecular structures.

BACKGROUND OF THE INVENTION

High-aspect ratio molecular structures (HARM-structures) such as carbon nanotubes, carbon nanobuds or other nanoscale structures with high aspect ratio possess unique electrical, optical, thermal and mechanical properties, which make them a promising material for many applications.

To deposit HARM structures, normally a force, such as drag force, electrostatic force, inertial force, photophoretic force, thermophoretic force or acoustic force, is applied upon an aerosol or a gas comprising HARM-structures. The force can move some of the HARM-structures based on one or more physical properties towards a predetermined location for depositing HARM-structures as a pattern by means of the applied force. The properties of HARM-structures can be anisotropic. Therefore, apparatuses and methods for oriented deposition of HARM-structures can be desirable.

SUMMARY OF THE INVENTION

The apparatuses according to the present invention are characterized by what is presented in independent claims 1 and 17.

The method according to the present invention is characterized by what is presented in independent claim 24.

According to a first aspect of the present invention, an apparatus is presented. The apparatus may be an apparatus for deposition of high aspect ratio molecular (HARM) structures or an apparatus for oriented deposition of HARM-structures. The apparatus comprises a deposition chamber, a filter, an inlet, an outlet and a control system. The deposition chamber is elongated horizontally and comprises a top portion with a top cover and a bottom portion with a bottom cover. The filter is positioned horizontally in the deposition chamber and separates the top portion from the bottom portion, and the filter comprises a deposition area. The deposition area refers to an area on the filter where deposition may take place in certain conditions. The filter may have one or more deposition areas.

The inlet is arranged in the top portion of the deposition chamber and is configured to provide a gas comprising HARM-structures into the deposition chamber. The outlet is arranged in the bottom portion of the deposition chamber and is configured to collect gas from the deposition chamber. The gas collected from the deposition chamber may be the gas comprising HARM-structures after or during the deposition of HARM-structures. The control system is configured to control gas flow at the inlet and the outlet.

In the present specification, the terms “top”, “bottom”, “horizontal” and any other terms indicating a geometric position should not be interpreted as limiting the apparatus to a specific geometric composition. These terms are used for clarity only and describe interrelation of elements of the device, to make the overall geometry of the claimed invention easier to understand. “Horizontal” may not be exactly horizontal or parallel to the ground, “top” and “bottom” may be interchangeable and simply refer to any two opposing portions of the structure.

Further according to the first aspect, the inlet, the outlet and the filter are arranged to create a gas flow path for the gas comprising HARM-structures from the inlet in the top portion towards the outlet in the bottom portion and through the filter. The direction of flow of the gas comprising HARM-structures (as they follow the path) in proximity to the deposition area of the filter is at least partially parallel to the filter. This is achieved by an appropriate positioning of the components in relation to each other, such as the inlet and the outlet being positioned at opposite sides of the filter; and may be assisted by the dimensions of the deposition chamber and additional elements inside the deposition chamber according to some of the embodiments below.

In addition, the control system and the relative positions of the inlet, the outlet, the top cover, the bottom cover and the filter are arranged to maintain a laminar gas flow of the gas comprising HARM-structures in proximity to the deposition area of the filter. The control system may be arranged to maintain the gas flow at the inlet and the outlet at a range necessary to maintain a laminar gas flow of the gas comprising HARM-structures.

The deposition area of the filter is an area of the filter where the HARM-structures from the gas comprising them are deposited.

In the first aspect, the apparatus is arranged to create a laminar flow of gas comprising HARM-structures in proximity to the deposition area of the filter, wherein the gas flows along a path which is at least partially parallel to the filter before the gas passes through it. This contributes to an effect of uniform and oriented deposition of the HARM-structures onto the filter. The HARM-structures generally may become oriented in the same direction as the direction of gas flow. The dimensions of the deposition chamber may be pre-selected to further optimize the laminar gas flow.

The outlet is configured to serve as an exhaust and can collect any gas from the deposition chamber, such as the gas comprising HARM-structures after it has passed through the filter for deposition.

The control system may comprise a controller and a plurality of pumps and/or controllers, configured to keep the flow rates within a predetermined range. The control system may also comprise compressed gas containers to provide the gas into the inlet, and gas channels of various geometry for optimal gas flow through the chamber.

The gas comprising HARM-structures can comprise a carrier gas, which may be any inert gas such as Nitrogen, Argon or Carbon Dioxide.

According to an embodiment, the control system and the relative positions of the inlet, the outlet, the top cover, the bottom cover and the filter are arranged to maintain the Reynolds number of the laminar gas flow of the gas comprising HARM-structures in proximity to the deposition area of the filter between 10 and 3500. The gas flow with a Reynolds number between 10 and 3500 has an additional effect of oriented deposition of the HARM-structures uniformly on the deposition area of the filter. It also remains laminar at this range of Reynolds number.

In an embodiment, the inlet and the outlet are positioned at opposing sides of the deposition chamber in the horizontal plane. In this embodiment, the gas flow path extends across the deposition chamber horizontally. This may allow the deposition to take place over a larger area of the filter and extend the deposition area.

According to an embodiment, the filter extends horizontally and is embedded into the deposition chamber between the top portion and the bottom portion at a predetermined distance from the top cover and the bottom cover of the deposition chamber. The embedded filter which extends horizontally may have one or more deposition areas across the area of the deposition chamber. The gas may pass through the filter anywhere depending on the selected parameters, additional elements configuration of the control system and physical dimensions of the deposition chamber. This configuration may be desirable in embodiments where wider area of deposition is required, or various additional structural features determine the gas path in the deposition chamber.

In an alternative embodiment, the apparatus comprises a support which encases the filter, extends horizontally and is embedded into the deposition chamber between the top portion and the bottom portion. The support may be a layer of any material which does not allow gas to go through, thereby limiting the gas path to go through the filter which the support encloses. The support may then seal the area outside of the filter. The sealing can create a settlement zone before the filter along the gas path. In an embodiment, the direction of flow of the gas comprising HARM-structures becomes parallel when passing the settlement zone. This leads to oriented deposition of HARM-structures on the filter after the settlement zone is passed. The support may be monolithic with the filter and easy to manufacture as a single component.

The settlement zone in this specification refers to a zone located for example before the deposition area in which the gas flow stabilizes, becomes laminar and substantially parallel to the deposition surface.

According to an embodiment, the apparatus comprises a first baffle with at least one opening, wherein the first baffle extends horizontally and is positioned adjacent to the filter, so that the gas flow path from the inlet towards the outlet passes through the portion of the filter adjacent to at least one opening in the first baffle. The first baffle may create a settlement zone before the portion of the filter adjacent to the at least one opening.

According to a further embodiment, the apparatus comprises a second baffle with at least one opening, wherein the second baffle extends horizontally and is positioned at a predetermined distance below the first baffle, creating a space between the first and second baffles and between top and bottom portions of the deposition chamber. The openings of the first baffle and the second baffle are arranged at opposing sides of the deposition chamber in the horizontal plane. This extends the length of the path that the gas comprising HARM-structures travel and creates favorable conditions for oriented deposition in predetermined portions of the filter. The extended length of the path can allow using a smaller deposition chamber.

The embodiments wherein the apparatus comprises one or more baffles provide an effect of reconfigurability inside the deposition chamber, since the baffles may be moved, changed or removed completely.

According to an embodiment, the distance from the top cover of the deposition chamber to the filter is between 0.1 and 10 millimeters, and the distance from the bottom cover of the deposition chamber to the filter is between 5 and 20 millimeters. These dimensions may be optimal for creating a laminar gas flow at the desired locations. Distance from top cover may refer to a distance from a predetermined point on the top cover if the shape of the top cover is not flat.

In an embodiment, the filter is a membrane filter. The membrane filter can be advantageous over other filter types in separating gas from HARM-structures.

According to an embodiment, the control system is further configured to control temperature and pressure inside the reaction chamber. The controlled temperature and pressure in the chamber can help create favorable conditions for deposition of HARM-structures onto the filter.

In an embodiment, the inlet has a circular shape in section and has a diameter between 5 and 100 millimeters. The circular inlet shape can be suitable for a wide range of gas flow speeds at the inlet.

In an alternative embodiment, the inlet is shaped as a slit, and has a width between 0.5 and 18 millimeters. The slit shape of the inlet can have an effect of improved control over the distribution of the gas comprising HARM-structures, and consequently the distribution of HARM-structures on the filter.

According to an embodiment, the deposition chamber has a rectangular shape in the horizontal plane, and the inlet and outlet are arranged in opposite corners of the deposition chamber in the horizontal plane. This shape may be easy to manufacture and fit standard requirements. The positions of inlet and outlet across the rectangle provide distribution of gas and potential deposition area across most of the space inside the chamber, horizontally. However, any other shape of the deposition chamber can also be used according to the embodiments of the invention.

In an embodiment, the apparatus comprises a porous plate with predetermined pore sizes extending horizontally and positioned below the filter in the deposition chamber. The porous plate may serve as an additional baffle with adjustable shape which can be varied by blocking or opening some of the pores prior to, or during, the deposition.

For purposes of this specification, HARM-structures refer to any micro- or nanoscale structures that have a high aspect ratio in one dimension, for example selected from the group of: carbon nanotube molecules, carbon nanobud molecules, graphene ribbons, carbon or graphite fiber filaments and silver nanowires.

In an embodiment, the dimensions of the deposition chamber are 100-200 mm in height, 390-1040 mm in width and 515-1240 mm in length. These dimensions cover a range of deposition chambers which may be preferred in deposition of HARM-structures at various scales.

According to a second aspect, an apparatus is presented. The apparatus may be an apparatus for depositing HARM-structures, an apparatus for oriented deposition of HARM-structures or an apparatus for oriented deposition of HARM-structures on a substrate.

The apparatus comprises a deposition chamber, a substrate, an inlet, at least one outlet and a control system. The deposition chamber is elongated horizontally, comprises a top portion with a top plate extending horizontally and a bottom portion with a bottom plate extending horizontally. The plates may have various structures, comprise various materials and are not necessarily solid or made in one piece.

The substrate is positioned horizontally in the deposition chamber between top plate and the bottom plate. The substrate may be place on top of the bottom plate or at a predetermined distance, according to embodiments.

The inlet is arranged in the top portion of the deposition chamber and configured to provide a gas comprising high aspect ratio molecular structures, HARM-structures, into the deposition chamber. The at least one outlet is also arranged in the top portion of the deposition chamber and configured to collect any gas from the deposition chamber, for example gas comprising HARM-structures after deposition.

The control system is configured to control gas flow at the inlet and the at least one outlet, and additionally to control temperatures and electric potentials of the top plate and the bottom plate.

The top plate and the substrate are positioned to create a gap between the top plate and the substrate, so that the flow of the gas comprising HARM-structures from the inlet towards the at least one outlet is substantially parallel to the substrate. The control system is configured to maintain temperature levels of the top plate and the bottom plate sufficiently different to create a temperature gradient in proximity to the substrate.

The control system may also be configured to maintain the electric potential of the top plate and the bottom plate at values sufficient to create a uniform electric field in proximity to the substrate The apparatus according second aspect is arranged to create a flow of gas comprising HARM-structures in proximity to the substrate and at least partially parallel to the substrate. This contributes to an effect of uniform and oriented deposition of the HARM-structures onto the substrate. The HARM-structures generally may become oriented in the same direction as the direction of gas flow. The temperature gradient created by different temperature levels of the top and the bottom plates can provide a drag force on the HARM-structures which contributes to the deposition. The uniform electric field created by different electric potential values of the top and bottom plates can provide electrophoresis leading to the deposition of HARM-structures. The dimensions of the deposition chamber may be preselected to optimize the laminar gas flow.

As explained in relation to the first aspect, the terms “top”, “bottom”, “horizontal” and any other terms indicating a geometric position should not be interpreted as limiting the apparatus to a specific geometric composition. These terms are used for clarity only and describe interrelation of elements of the device, to make the overall geometry of the claimed invention easier to understand.

The apparatus according to the second aspect may be suitable for deposition on flat substrates in deposition chambers with substantially flat top and bottom plates. However, the apparatus according to the second aspect may also be suitable for deposition in a chamber of various shapes on curved substrates. For example, the apparatus may be used for oriented deposition of HARM-structures in a drum-shaped or concave deposition chamber. In some embodiments, the gap between the substrate and the top plate is of constant height along the deposition chamber.

In an embodiment of the second aspect, the control system and the relative positions of the inlet, the outlet, the top plate, the bottom plate and the substrate are arranged to maintain the gas flow of the gas comprising HARM-structures in proximity to the substrate laminar with a Reynolds number between 10 and 3500. The gas flow with a Reynolds number between 10 and 3500 remains laminar and has an additional effect on oriented deposition of the HARM-structures uniformly on the substrate.

According to an embodiment of the aspect, the apparatus further comprises at least one barrier gas inlet positioned in proximity to the at least one outlet configured to provide a barrier gas into the deposition chamber to prevent the gas comprising HARM-structures from spreading further in the deposition chamber. The inlet with barrier gas may be effective in embodiments wherein gas should be prevented from escaping through outer borders or spreading further from the substrate.

In an embodiment, the inlet is arranged in a central area of the top portion of the deposition chamber, and the at least one outlet is arranged in a peripheral area of the deposition chamber. In embodiments comprising one or more barrier gas inlets, they may also be positioned at the periphery of the deposition chamber, so as to prevent gas comprising HARM-structures from spreading further than the outlets positioned in the peripheral area. The structure wherein the inlet is positioned in a central area, and the outlets are at the periphery, may be desired in an apparatus equipped with a roll to roll system for the substrates, resulting in a uniform deposition across width of the substrates. Apparatuses with this structure may also be positioned adjacent to each other in any configuration necessary.

According to an embodiment, the distance from the top plate to the substrate is between 0.5 and 5 millimeters, and the distance from the bottom plate to the substrate is between 0 and 5 millimeters.

In an embodiment, the control system is arranged to maintain a higher temperature level of the top plate and a lower temperature level of the lower plate, thereby creating a temperature gradient between the heated plate and the cooled plate.

In an embodiment, the substrate is a plastic film. A plastic film may be an accessible and suitable substrate for oriented deposition of HARM-structures. Any other substrate alternatives are also within the scope of the second aspect.

A system is provided in a third aspect of the present invention. The system comprises two or more apparatuses of any one of the embodiments of the second aspect, positioned adjacent to each other. The system may be a system for larger-scale deposition of HARM-structures.

According to a fourth aspect, a method for oriented deposition of HARM-structures is presented. The method comprises: providing, via an inlet, a gas comprising HARM-structures into a deposition chamber at a predetermined gas flow rate. The predetermined gas flow rate may be controlled by a control system. The method also comprises maintaining a laminar flow of the gas comprising HARM-structures at a Reynolds number between 10 and 3500 in proximity to a deposition area of a substrate or a filter, wherein the laminar flow of the gas comprising HARM-structures is least partially parallel to the substrate or the filter. Method further comprises depositing HARM-structures in the deposition area of the substrate or the filter from the gas comprising HARM-structures, and collecting, via an outlet, the remaining gas from the deposition chamber at a predetermined gas flow rate.

The method may be performed by any suitable apparatus for depositing HARM-structures, for example by any of the apparatuses according to the first and second aspects. The method provides an advantageous uniformity and efficiency of oriented deposition of HARM-structures due to the surprising effect that a laminar gas flow parallel to a substrate or filter has on the outcome of deposition.

The apparatus and method according to the present invention can be easy incorporated into various devices for production.

The embodiments of the invention described hereinbefore may be used in any combination with each other. Several of the embodiments may be combined together to form a further embodiment of the invention. A product, a method or a use to which the invention is related may comprise at least one of the embodiments of the invention described hereinbefore.

BRIEF DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION OF THE INVENTION

In the following, the present invention will be described in more detail with exemplary implementations by referring to the accompanying figures.

Embodiments of the present invention make use of an effect which occurs when a laminar flow of gas comprising HARM-structures travels over a flat filter parallel to its surface, before passing through the filter. The effect manifests in oriented deposition of HARM-structures on the filter, wherein the orientation normally coincides with the direction of gas flow. A similar effect occurs in deposition directly on a substrate, wherein the laminar flow of gas comprising HARM-structures passing over a flat substrate parallel to its surface can lead to oriented deposition of HARM-structures on the substrate. For deposition on the substrate, a temperature gradient or electric field can also be used to create conditions for oriented deposition of HARM-structures in the deposition chamber.

The following examples are provided for better understanding of the invention and should not be construed as limiting.

Figure 1:
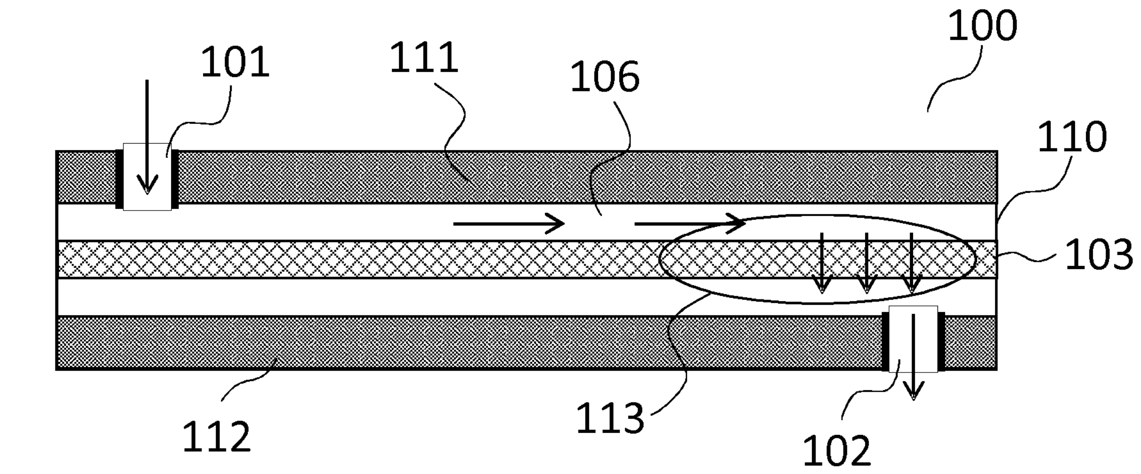
FIG. 1 is a schematic illustration of an apparatus comprising a filter according to an aspect.
Figure 2:
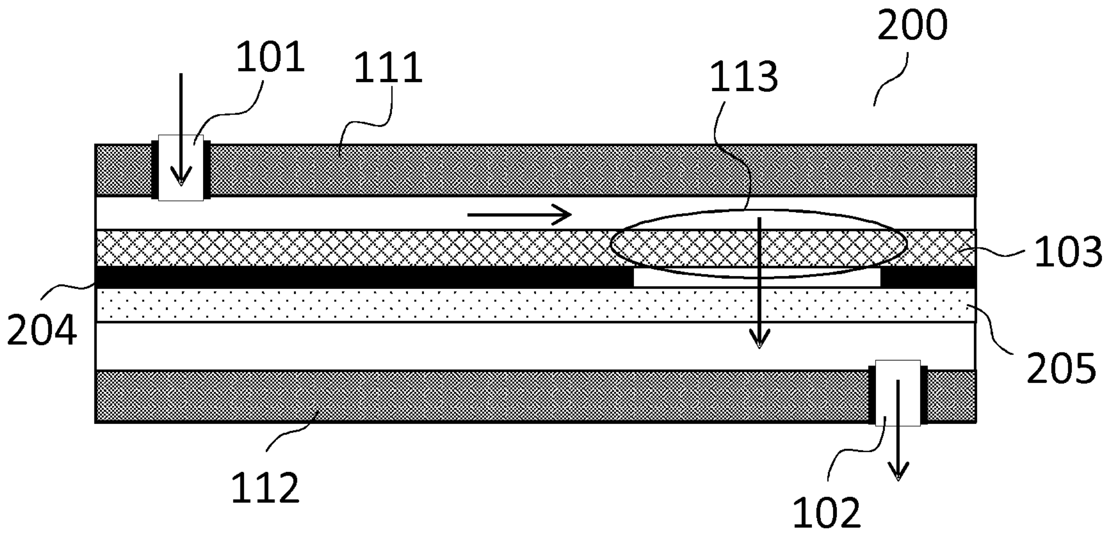
FIG. 2 is a schematic illustration of an apparatus comprising a filter and a baffle according to an embodiment.
Figure 3:
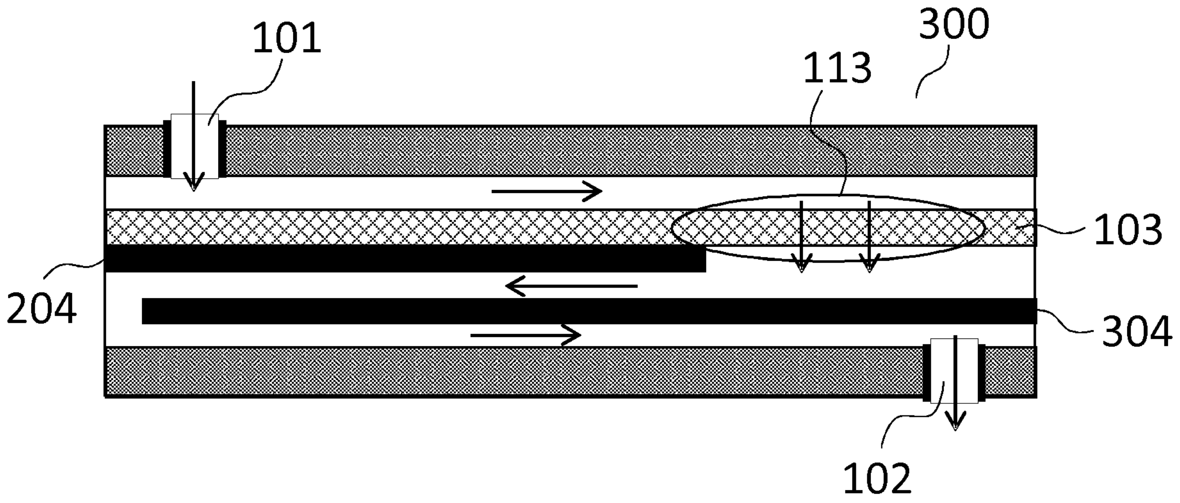
FIG. 3 is a schematic illustration of an apparatus comprising a filter and two baffles according to an embodiment.

FIGS. 1-3 schematically show apparatuses 100 for depositing HARM-structures. The apparatus 100 on FIG. 1 comprises a deposition chamber 110 which is elongated horizontally, encases the other elements and comprises a top portion with a top cover 111 and a bottom portion with a bottom cover 112. The top cover 111 comprises an inlet 101 arranged in the top portion and configured to provide a gas comprising HARM-structures into the deposition chamber 110, and the bottom cover 112 comprises an outlet 102 arranged in the bottom portion and configured to collect gas from the deposition chamber 110.

The apparatus 100 further comprises a filter 103 which extends horizontally and separates the top portion from the bottom portion. The filter 103 may be a membrane filter or any other suitable type. The filter 103 comprises a deposition area 113, which is illustrated by an oval only schematically and may have no pre-determined position on the filter 103. The deposition area is the area in which oriented deposition of HARM-structures takes place and may depend on various factors, such as the dimensions of the chamber 110, gas flow velocity, and other conditions. Approximate gas flow path from the inlet 101 to outlet 102 is indicated by the arrows on FIGS. 1-3.

The apparatus 100 of FIG. 1, as well as the apparatuses of FIGS. 2-3, further comprises a control system (not shown in the Figures), configured to control gas flow at the inlet and the outlet. The control system may comprise pumps and controllers, such as computer-based controllers, to control the flow rate at inlet and outlet, and in some examples gas channels of predefined shapes and compressed gas containers. The control system may be configured to define these properties before providing any gas into the chamber, and/or adjust the gas flow rates, temperatures or any other properties during the deposition.

The deposition area 113 may coincide with the area of the filter 103 where the gas passes through the filter 103. The gas flow path of the gas comprising HARM-structures is created by the arrangement of the inlet 101, the outlet 102 and the filter 103, and is approximately indicated by the arrows. The direction of flow of the gas comprising HARM-structures in proximity to the deposition area 113 of the filter is at least partially parallel to the filter 103. The control system and the relative positions of the inlet 101, the outlet 102, the top cover 111, the bottom cover 112 and the filter 103 are arranged to maintain a laminar gas flow of the gas comprising HARM-structures in proximity to the deposition area of the filter. The laminar gas flow with a direction that is at least partially parallel to the filter 103 in proximity to the deposition area 113 results in oriented deposition of HARM-structures on the filter 103. In particular, a laminar gas flow of the gas comprising HARM-structures with a Reynolds number in the range between 10 and 3500 has shown to provide efficient oriented deposition.

The apparatuses 100, 200, 300 on FIGS. 1-3 are also illustrated with a gap 106 between the filter and the top cover 111, and its dimensions in combination with gas flow rate and other parameters may further contribute to the laminar gas flow over the filter 103. The inlet 101 and the outlet 102 are positioned horizontally at opposing sides of the deposition chamber 110 in these examples. This provides easier control of the direction of gas flow. Alternatively, the inlet 101 and the outlet 102 may be positioned closer to each other in the horizontal plane, and the gas flow path at least partially parallel to the filter may be created by other means described herein.

The filter 103 in FIGS. 1-3 extends horizontally and is embedded into the deposition chamber 110 between the top portion and the bottom portion at a predetermined position. In other examples, the filter 103 may be encased in a support element, or the filter 103 may be positioned in the deposition chamber 110 with a distance between the horizontal edges of the filter 103 and the side walls of the chamber 110. The arrangement wherein the filter 103 is not embedded into the deposition chamber 110 may be cheaper to produce and/or beneficial if additional exhausts are provided in the side walls of the deposition chamber 110. The additional exhausts or outlets may also affect the direction of gas flow.

Potions of the filter 103 may be encased by a support (not shown), so that the gas comprising HARM-structure may physically pass only through the portions which are not encased by the support. The support may extend horizontally and be embedded into the deposition chamber 110, wherein the filter would be for example an opening in the support. The support which does not let gas through may create a settlement zone before the gas flow path goes through the filter 103.

FIG. 2 shows an example wherein the apparatus 200 comprises a baffle 204 with at least one opening. The baffle 204 extends horizontally and is positioned adjacent to the filter 103, so that the gas flow path from the inlet 101 towards the outlet 102 passes through the portion of the filter 103 adjacent to at least one opening in the baffle 204. The baffle 204 also creates a settlement zone before the deposition area 113 approximately indicated by an oval. In the settlement zone, the flow of gas may stabilize, become laminar and parallel to the filter 103, to provide conditions for oriented deposition of HARM-structures when gas passes the settlement zone and enters the deposition area 113.

The apparatus 200 of FIG. 2 additionally includes a porous plate 205. The porous plate 205 may have predetermined pore sizes and extend horizontally, positioned below the filter 103 in the deposition chamber 110. The porous plate 205 may serve as an additional baffle with adjustable shape which changes when some of the pores are blocked or open. The porous plate 205 is illustrated on FIG. 2 for example purposes only and may be used in any of the apparatuses shown in other examples.

FIG. 3 schematically shows implementation of an apparatus 300 which comprises two baffles 204, 304. The first baffle 204 may be positioned similarly to the baffle 204 of the previous example. The second baffle 304 also comprises at least one opening and extends horizontally. The second baffle 304 is positioned at a predetermined distance below the first baffle 204, creating a space between them and between top and bottom portions of the deposition chamber. The openings of the first baffle and the second baffle are arranged at opposing sides of the deposition chamber 110 in the horizontal plane. This extends the length of the path that the gas comprising HARM-structures travels, as depicted by the arrows. The extended length of the path can allow using a smaller deposition chamber 110.

In an implementation, the dimensions of the elements positioned in the deposition chamber 110 are as follows. The distance from the top cover 111 of the deposition chamber 110 to the filter 103 is between 0.1 and 10 mm, and the distance from the bottom cover 112 of the deposition chamber 110 to the filter 103 is between 5 and 20 mm.

Figure 4:
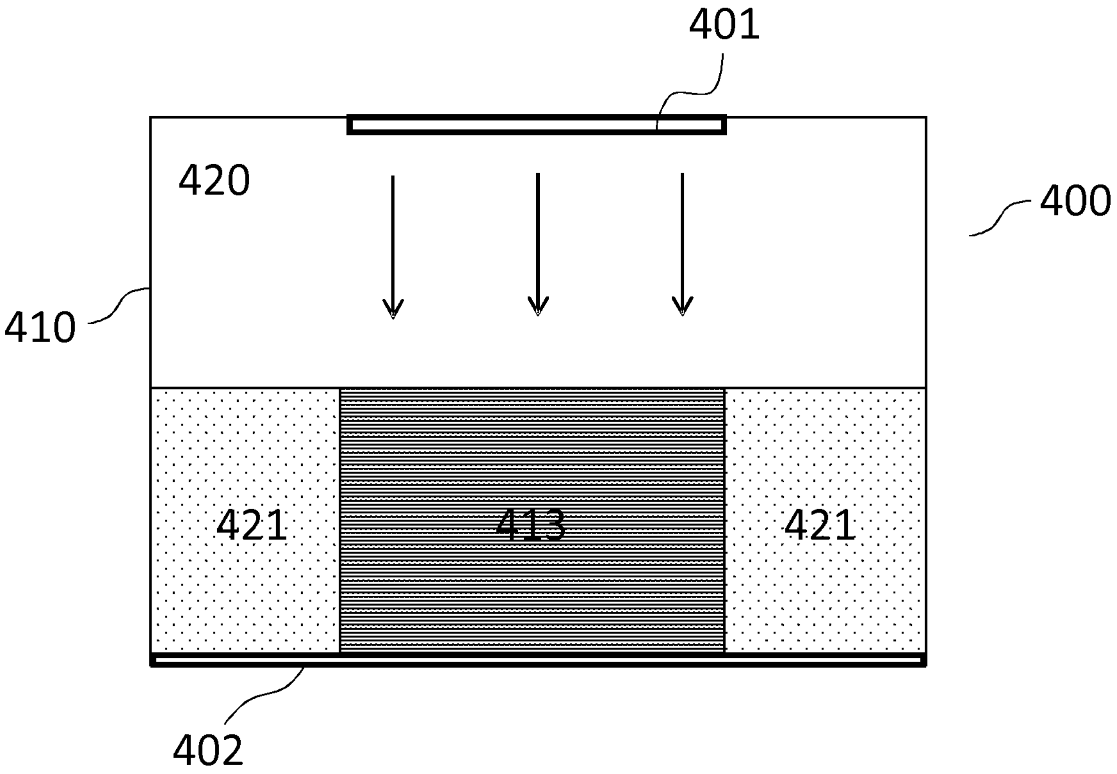
FIG. 4 is a schematic illustration of an apparatus with alternative positions of inlet and outlet according to an embodiment.

FIG. 4 illustrates an implementation of an apparatus 400 wherein the inlet 401 and the outlet 402 are extended in length and positioned along the deposition chamber 410 walls. FIG. 4 is a schematic top view of an apparatus with a filter (not shown). The outlet 402 is positioned on the opposite side of the filter in the vertical plane (not visible in the top view of FIG. 4). In this example, the gas comprising HARM-structures spreads in the horizontal plane inside the deposition chamber 410, and the deposition chamber 410 can be schematically split into various zones along the path of the gas flow. The settlement zone 420 is the zone wherein the gas flow of the gas comprising HARM-structures becomes laminar and parallel to the deposition surface, before entering the deposition area 413. On the sides 421, which are also referred to as a sacrifice zone, the oriented deposition may be less likely to take place, so they may be excluded from the deposition area 413.

Figure 5A:
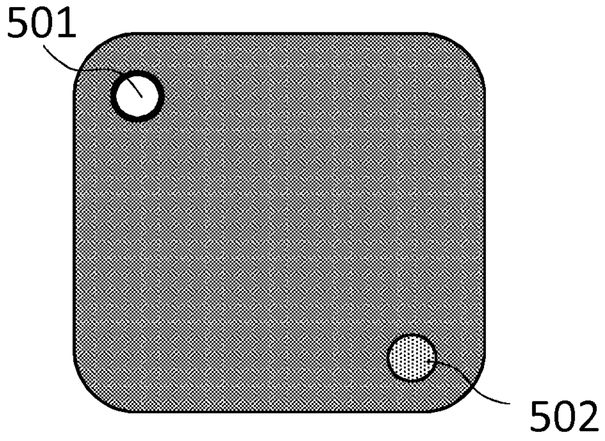
FIG. 5*a* is a schematic illustration of relative inlet and outlet positions in the horizontal plane.
Figure 5B:
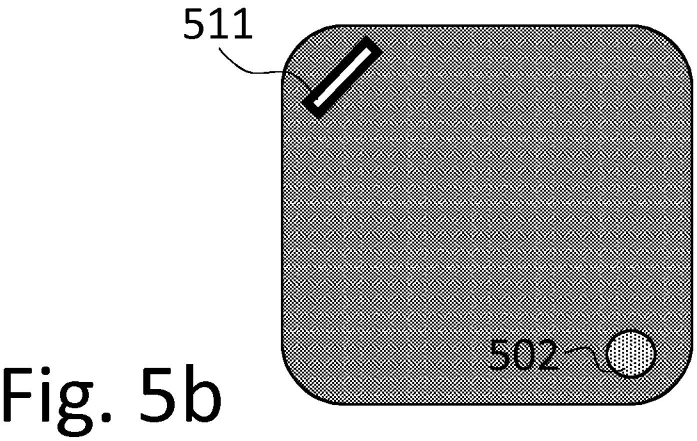
FIG. 5*b* is a schematic illustration of an alternative inlet shape.

Implementations with alternative positions of the inlet and outlet are illustrated on FIGS. 5*a*-5*b*. The inlet 501 and outlet 502 on FIG. 5*a* are positioned at opposing corners of the deposition chamber. The inlet 501 is circular in shape and has a diameter between 5 and 25 millimeters. The circular shape can be suitable for a wide range of gas flow speeds at the inlet 501.

The inlet 511 depicted in FIG. 5*b* has the shape of a slit, and a width between 0.5 and 18 millimeters. The slit shape of the inlet 511 can have an effect of improved control over the distribution of the gas comprising HARM-structures, and consequently the distribution of HARM-structures on the filter. In the example depicted on FIG. 4, the inlet 401 may also be slit-shaped.

Other shapes of the inlet, the outlet and the deposition chamber can also be used within the scope of the present invention, and the positions of the inlet and the outlet may vary.

Figure 6:
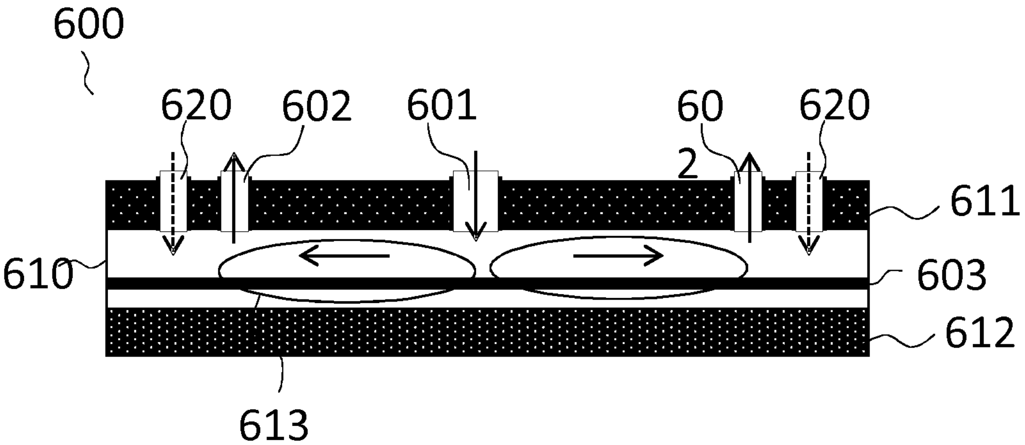
FIG. 6 is a schematic illustration of an apparatus comprising a substrate according to an aspect.

An apparatus according to another aspect is shown on FIG. 6. The apparatus 600 is designed for oriented deposition of HARM-structures on a substrate, as opposed to a filter as shown in FIGS. 1-3. The apparatus 600 comprises a deposition chamber 610 elongated horizontally which includes a top portion with a top plate 611 extending horizontally and a bottom portion with a bottom plate 612 extending horizontally. The apparatus 600 illustrated on FIG. 6 includes a substrate 603 positioned horizontally in the deposition chamber 610 between the top plate 611 and the bottom plate 612. The substrate 603 may be a plastic film, or any other suitable substrate. An inlet 601 arranged in the top portion and going through the top plate 611 of the deposition chamber 610 is configured to provide a gas comprising HARM-structures into the deposition chamber 610. The outlets 602 are also arranged in the top portion of the deposition chamber 610, going through the top plate 611. The apparatus may have one or more outlets 602, the example implementation of FIG. 6 includes two. The outlets 602 are configured to collect gas from the deposition chamber.

The apparatus 600 also includes a control system (not shown) configured to control gas flow at the inlet 601 and the outlets 602, and the temperature and electric potential of the top plate 611 and the bottom plate 612. The control system may comprise pumps and controllers to control the flow rate at inlet 601 and outlet 602, and in some examples gas channels of predefined shapes and compressed gas containers. The control system may comprise computer-based controllers. The control system is configured to define properties before providing any gas into the chamber, and/or adjust the gas flow rates, temperatures, electric potentials of the plates 611, 612 or any other properties during the deposition.

The top plate 611 and the substrate 603 are positioned to create a gap between the top plate 611 and the substrate 603, so that the flow of the gas comprising HARM-structures from the inlet 601 towards the outlets 602 is substantially parallel to the substrate 603 in the deposition areas 613 (illustrated only approximately by the ovals). The control system is configured to maintain different temperature levels of the top plate 611 and the bottom plate 612 to create a temperature gradient in proximity to the substrate 603. The temperature gradient created by different temperature levels of the top and the bottom plates 611, 612 can provide a drag force on the HARM-structures which creates conditions for the oriented deposition. The control system can also, in addition or alternatively to maintaining the temperature levels, be configured to maintain electric potentials of the top plate 611 and the bottom plate 612 at values sufficient to create a uniform electric field in proximity to the substrate 603. The uniform electric field creates the condition for electrophoresis leading to the deposition of HARM-structures on the substrate 603.

To maintain the gas flow laminar in various conditions, and thereby reinforce the effect of oriented deposition of HARM-structures in the deposition area 613, the control system and the relative positions of the inlet 601, the outlets 602, the top plate 611, the bottom plate 612 and the substrate 603 can be arranged to maintain the gas flow of the gas comprising HARM-structures in proximity to the substrate 603 laminar with a Reynolds number between 10 and 3500.

The apparatus 600 shown on FIG. 6 also comprises the optional barrier gas inlets 620 positioned in proximity to the outlets 602. The barrier gas inlets 620 are configured to provide a barrier gas into the deposition chamber 610 to prevent the gas comprising HARM-structures from spreading further in the deposition chamber 610. In the implementation illustrated in FIG. 6, the inlet 601 is arranged in a central area of the top portion of the deposition chamber 610, and the outlets 602, as well as the barrier gas inlets 620, are arranged in a peripheral area of the deposition chamber 610. The barrier gas may be nitrogen, argon, carbon monoxide, CO2 or other either inert or filterable gas composition.

In an example implementation, the distance from the top plate 611 to the substrate 603 is between 0.5 and 5 millimeters, and the distance from the bottom plate 612 to the substrate 603 is between 0 and 5 millimeters. The top plate 611 may be heated, while the bottom plate 612 may be cooled to create the temperature gradient.

Two or more apparatuses 600 shown in FIG. 6 may be positioned adjacent to each other to create a system. The system may have a substrate which goes through multiple apparatuses 600 positioned adjacent to each other.

The apparatus 600 is illustrated on FIG. 6 to have substantially flat top and bottom plates 611, 612 as well as the substrate 603. However, the apparatus 600 according to this aspect may also be suitable for deposition in a chamber of various shapes on curved substrates. For example, the apparatus 600 may be used for oriented deposition of HARM-structures in a drum-shaped or concave deposition chamber.

Figure 7:
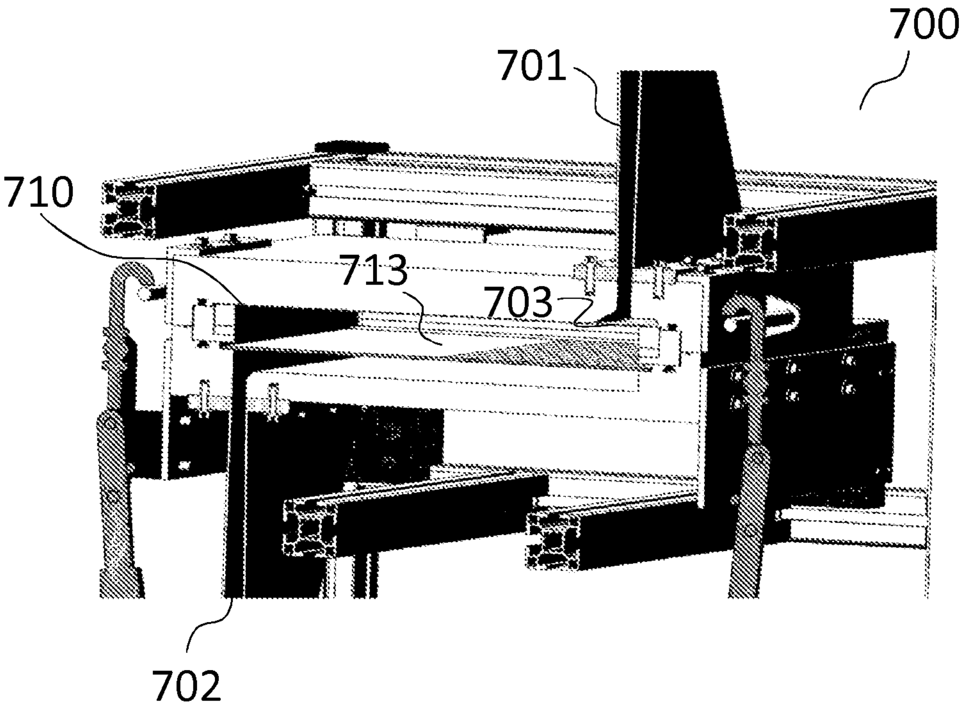
FIG. 7 illustrates an example apparatus for deposition on a filter according to an implementation.

FIG. 7 shows an example of an apparatus 700 according to an implementation of the first aspect. The apparatus 700 comprises an inlet 701 and an outlet 701 connected to the deposition chamber 710. The inlet 701 is arranged in the top portion of the chamber 710, while the outlet 702 is arranged in the bottom portion. The inlet 701 and the outlet 702 are cone-shaped in this example. The apparatus 700 further comprises a filter 703 positioned at 0-10 mm from the top portion; and a perforated porous plate 713. The porous plate 713 may be used as a baffle with adjustable opening sizes for controlled gas diffusion in the chamber 710. The deposition chamber 710 may also comprise one or more baffles which make the gas flow path reach the porous plate 713 from the inlet 701 on the left side of the chamber 710 shown in FIG. 7. The dimensions of this figure are approximate and may not reflect the actual relative sizes of the elements of apparatus 700.

Figure 8:
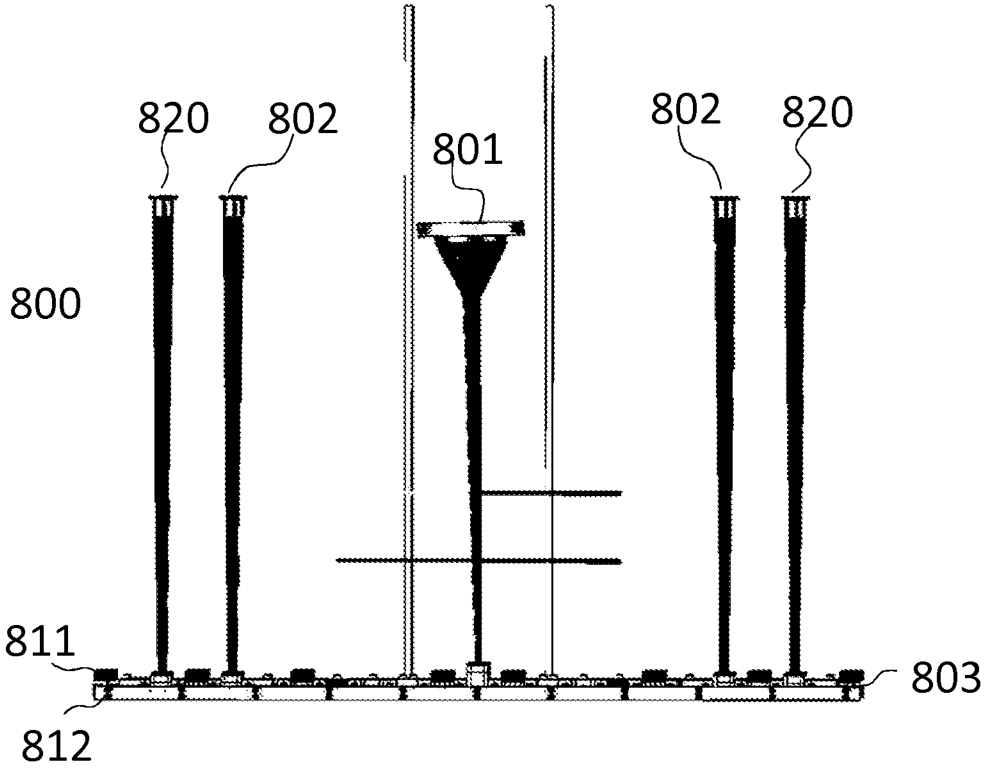
FIG. 8 illustrates an example apparatus for deposition on a substrate according to an implementation.

FIG. 8 shows an example of an apparatus 800 according to an implementation of the second aspect. The apparatus 800 comprises a top plate 811 which is heated, a cooled bottom plate 812 and a deposition chamber between them (not indicated, the thin gap between the top plate 811 and the bottom plate 812). The apparatus 800 also comprises a substrate 803 positioned on the bottom plate 812. Furthermore, the apparatus comprises a central inlet 801, and two outlets 802 connected to a peripheral position of the deposition chamber. The apparatus 800 also comprises barrier gas inlets 820 connected to a further peripheral location to prevent the gas from going past the outlets 802. The dimensions of FIG. 8 are approximate and may not reflect the actual relative sizes of the elements of apparatus 700.

Figure 9:
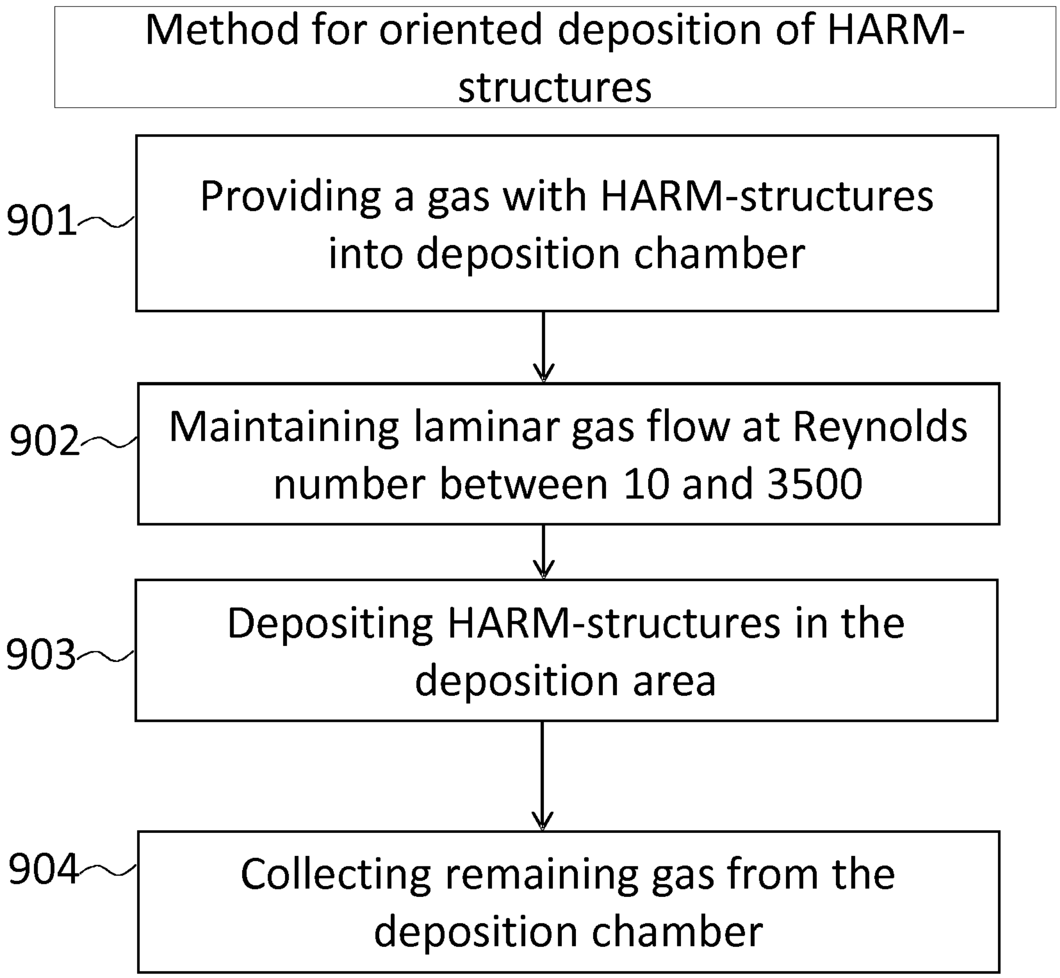
FIG. 9 is a flow chart illustrating a method according to an aspect.

FIG. 9 is a flow chart of a method for oriented deposition of HARM-structures, according to an aspect. The method comprises providing 901, via an inlet, a gas comprising HARM-structures into a deposition chamber at a predetermined gas flow rate. The gas flow rate may be determined by a control unit. The method further includes maintaining 902 a laminar flow of the gas comprising HARM-structures at a Reynolds number between 10 and 3500 in proximity to a deposition area of a substrate or a filter. The laminar flow of the gas comprising HARM-structures in step 902 is least partially parallel to the substrate or the filter. The laminar gas flow may be maintained by the control system in combination with the relative positions of the inlet, the outlet and other elements in the deposition chamber. As the laminar gas flow is maintained at 902 in the appropriate conditions, the method further comprises depositing 903 HARM-structures in the deposition area of the substrate or the filter from the gas comprising HARM-structures. The deposition 903 occurs when the laminar and substantially parallel gas flow reaches the deposition area of the filter or substrate. Method then includes collecting 904, via an outlet, the remaining gas from the deposition chamber at a predetermined gas flow rate. The predetermined flow rates and laminar gas flow allows for oriented deposition of HARM-structures.

The method may be performed by any suitable apparatus for depositing HARM-structures, for example by any of the apparatuses according to the first and second aspects. The method may also be carried out by a control system comprising a computer. The method provides an advantageous uniformity and efficiency of oriented deposition of HARM-structures due to the surprising effect that a laminar gas flow parallel to a substrate or filter has on the outcome of deposition.

Example

An apparatus for oriented deposition of HARM-structures on a filter, which is an example of the first aspect described above, comprises: a deposition chamber which is 160×390×515 mm (height×width×length). The gas flow rates are maintained at 20-50 lither/min, and the temperature in the chamber is 20-80 Celsius. The gas provided at the inlet is a carrier gas nitrogen comprising Carbon Nanobuds. A membrane filter is embedded into the deposition chamber between the top portion and the bottom portion at a distance of 0.5-2 mm from the top portion. The membrane filter collects the Carbon Nanobuds in a deposition area which is approximately 150×420 mm. The orientation of the Carbon Nanobuds deposited in the abovementioned conditions can be estimated with an orientation index (ratio of maximum resistance to minimum resistance) in a range of 1.3-2.2. The apparatus further comprises a baffle with an opening positioned under the filter, the baffle creates a settlement zone and is approximately 150×420 mm in size.

As it is clear to a person skilled in the art, the invention is not limited to the example described above, but the embodiments can freely vary within the scope of the claims.

The invention claimed is:

1. An apparatus, comprising:
a deposition chamber elongated horizontally and comprising a top portion with a top cover and a bottom portion with a bottom cover,
a filter positioned horizontally in the deposition chamber separating the top portion from the bottom portion, wherein the filter comprises a deposition area,
an inlet arranged in the top portion of the deposition chamber and configured to provide a gas comprising high aspect ratio molecular structures, HARM-structures, into the deposition chamber,
an outlet arranged in the bottom portion of the deposition chamber and configured to collect gas from the deposition chamber, and
a control system configured to control gas flow at the inlet and the outlet, wherein
the inlet, the outlet and the filter are arranged to create a gas flow path for the gas comprising HARM-structures from the inlet in the top portion towards the outlet in the bottom portion and through the filter, wherein the direction of flow of the gas comprising HARM-structures in proximity to the deposition area of the filter is at least partially parallel to the filter; and wherein
the control system and the relative positions of the inlet, the outlet, the top cover, the bottom cover and the filter are arranged to maintain a laminar gas flow of the gas comprising HARM-structures in proximity to the deposition area of the filter.

2. The apparatus of claim 1, wherein the control system and the relative positions of the inlet, the outlet, the top cover, the bottom cover and the filter are arranged to maintain the Reynolds number of the laminar gas flow of the gas comprising HARM-structures in proximity to the deposition area of the filter between 10 and 3500.

3. The apparatus of claim 1, wherein the inlet and the outlet are positioned at opposing sides of the deposition chamber in the horizontal plane.

4. The apparatus of claim 1, wherein:
the filter extends horizontally and is embedded into the deposition chamber between the top portion and the bottom portion at a predetermined distance from the top cover and the bottom cover of the deposition chamber.

5. The apparatus of claim 1, comprising a support which encases the filter, extends horizontally and is embedded into the deposition chamber between the top portion and the bottom portion.

6. The apparatus of claim 1, comprising a first baffle with at least one opening, wherein the first baffle extends horizontally and is positioned adjacent to the filter, so that the gas flow path from the inlet towards the outlet passes through the portion of the filter adjacent to at least one opening in the first baffle.

7. The apparatus of claim 6, comprising a second baffle with at least one opening, wherein
the second baffle extends horizontally and is positioned at a predetermined distance below the first baffle, creating a space between the first and second baffles and between top and bottom portions of the deposition chamber, and wherein
the openings of the first baffle and the second baffle are arranged at opposing sides of the deposition chamber in the horizontal plane.

8. The apparatus of claim 1, wherein the distance from the top cover of the deposition chamber to the filter is between 0.1 and 10 millimeters, and the distance from the bottom cover of the deposition chamber to the filter is between 5 and 20 millimeters.

9. The apparatus of claim 1, wherein the filter is a membrane filter.

10. The apparatus of claim 1, wherein the control system is further configured to control temperature and pressure inside the reaction chamber.

11. The apparatus of claim 1, wherein the inlet has a circular shape in section and has a diameter between 5 and 100 millimeters.

12. The apparatus of claim 1, wherein the inlet is shaped as a slit, and has a width between 0.5 and 18 millimeters.

13. The apparatus of claim 1, wherein the deposition chamber has a rectangular shape in the horizontal plane, and the inlet and outlet are arranged in opposite corners of the deposition chamber in the horizontal plane.

14. The apparatus of claim 1, comprising a porous plate with predetermined pore sizes extending horizontally and positioned below the filter in the deposition chamber.

15. The apparatus of claim 1, wherein the HARM-structures are selected from the group of: carbon nanotube molecules, carbon nanobud molecules, graphene ribbons, carbon or graphite fiber filaments and silver nanowires.

16. The apparatus of claim 1, wherein the dimensions of the deposition chamber are: 100-200 mm in height, 390-1040 mm in width and 515-1240 mm in length.

17. An apparatus, comprising:
a deposition chamber elongated horizontally and comprising a top portion with a top plate extending horizontally and a bottom portion with a bottom plate extending horizontally,
a substrate positioned horizontally in the deposition chamber between top plate and the bottom plate,
an inlet arranged in the top portion of the deposition chamber and configured to provide a gas comprising high aspect ratio molecular structures, HARM-structures, into the deposition chamber,
at least one outlet arranged in the top portion of the deposition chamber and configured to collect gas from the deposition chamber, and
a control system configured to control gas flow at the inlet and the at least one outlet, and the temperature and electric potential of the top plate and the bottom plate, wherein
the top plate and the substrate are positioned to create a gap between the top plate and the substrate, so that the flow of the gas comprising HARM-structures from the inlet towards the at least one outlet is substantially parallel to the substrate, and wherein
the control system is configured to:
maintain the temperature of the top plate and the bottom plate at levels sufficiently different to create a temperature gradient in proximity to the substrate, and/or
maintain the electric potential of the top plate and the bottom plate at values sufficient to create a uniform electric field in proximity to the substrate.

18. The apparatus of claim 17, wherein the control system and the relative positions of the inlet, the outlet, the top plate, the bottom plate and the substrate are arranged to maintain the gas flow of the gas comprising HARM-structures in proximity to the substrate laminar with a Reynolds number between 10 and 3500.

19. The apparatus of claim 17, further comprising at least one barrier gas inlet positioned in proximity to the at least one outlet configured to provide a barrier gas into the deposition chamber to prevent the gas comprising HARM-structures from spreading further in the deposition chamber.

20. The apparatus of claim 17, wherein the inlet is arranged in a central area of the top portion of the deposition chamber, and the at least one outlet is arranged in a peripheral area of the deposition chamber.

21. The apparatus of claim 17, wherein the distance from the top plate to the substrate is between 0.5 and 5 millimeters, and the distance from the bottom plate to the substrate is between 0 and 5 millimeters.

22. The apparatus of claim 17, wherein the substrate is a plastic film.

23. A system comprising two or more apparatuses of claim 17 positioned adjacent to each other.

24. A method for oriented deposition of HARM-structures, the method comprising:

providing, via an inlet, a gas comprising HARM-structures into a deposition chamber at a predetermined gas flow rate, wherein the deposition chamber is elongated horizontally and comprises a top portion and a bottom portion, an inlet in the top portion and an outlet in the bottom portion, the deposition chamber being capable of holding a filter positioned horizontally separating the top portion from the bottom portion;

maintaining a laminar flow of the gas comprising HARM-structures at a Reynolds number between 10 and 3500 in proximity to a deposition area of the filter, wherein the laminar flow of the gas comprising HARM-structures is least partially parallel to the filter;

depositing HARM-structures in the deposition area of the filter from the gas comprising HARM-structures; and collecting, via an outlet, the remaining gas from the deposition chamber at a predetermined gas flow rate.

25. The method of claim 24, further comprising controlling temperature and pressure inside the deposition chamber.

26. A method for oriented deposition of HARM-structures, the method comprising:

providing, via an inlet, a gas comprising HARM-structures into a deposition chamber at a predetermined gas flow rate, wherein the deposition chamber is elongated horizontally and comprises a top portion and a bottom portion, an inlet in the top portion and an outlet in the top portion, and a control system, the deposition chamber being capable of holding a substrate positioned horizontally separating the top portion from the bottom portion;

maintaining a laminar flow of the gas comprising HARM-structures at a Reynolds number between 10 and 3500 in proximity to a deposition area of the substrate, wherein the laminar flow of the gas comprising HARM-structures is least partially parallel to the substrate;

depositing HARM-structures in the deposition area of the substrate from the gas comprising HARM-structures; and collecting, via an outlet, the remaining gas from the deposition chamber at a predetermined gas flow rate.

27. The method of claim 26, further comprising:

using the control system to maintain the temperature of the top plate and the bottom plate at levels sufficiently different to create a temperature gradient in proximity to the substrate.

28. The method of claim 26, further comprising:

using the control system to maintain the electric potential of the top plate and the bottom plate at values sufficient to create a uniform electric field in proximity to the substrate.

* * * * *